(12) United States Patent
Trimberger et al.

(10) Patent No.: US 8,872,536 B1
(45) Date of Patent: Oct. 28, 2014

(54) CHARACTERIZING DIES

(75) Inventors: Stephen M. Trimberger, San Jose, CA (US); Babak Ehteshami, Redwood City, CA (US)

(73) Assignee: Xilinx, Inc., San Jose, CA (US)

( * ) Notice: Subject to any disclaimer, the term of this patent is extended or adjusted under 35 U.S.C. 154(b) by 620 days.

(21) Appl. No.: 13/069,319

(22) Filed: Mar. 22, 2011

(51) Int. Cl.
*G01R 31/02* (2006.01)

(52) U.S. Cl.
USPC ............ 324/762.01; 324/762.03; 324/757.03; 324/757.04; 324/762.05

(58) Field of Classification Search
CPC .................. G01R 31/318511; G01R 31/2884; G01R 31/31718
See application file for complete search history.

(56) References Cited

U.S. PATENT DOCUMENTS

| | | | |
|---|---|---|---|
| 5,818,250 A * | 10/1998 | Yeung et al. ............. 324/762.02 |
| 5,927,512 A * | 7/1999 | Beffa ............................ 209/573 |
| 6,144,262 A | 11/2000 | Kingsley |
| 6,219,305 B1 * | 4/2001 | Patrie et al. .................... 368/113 |
| 6,367,041 B1 | 4/2002 | Statovici et al. |
| 6,466,520 B1 | 10/2002 | Speyer et al. |
| 6,507,942 B1 | 1/2003 | Calderone et al. |
| 6,587,975 B2 * | 7/2003 | Mori et al. ..................... 714/723 |
| 6,775,787 B2 * | 8/2004 | Greene ......................... 713/340 |
| 6,788,095 B1 | 9/2004 | Mark et al. |
| 6,862,548 B1 | 3/2005 | Chan |
| 6,984,533 B1 * | 1/2006 | Regos et al. ..................... 438/15 |
| 7,119,570 B1 | 10/2006 | Chirania et al. |
| 7,231,621 B1 | 6/2007 | Herron et al. |
| 7,262,623 B1 | 8/2007 | Mark et al. |
| 7,406,670 B1 * | 7/2008 | Ansari et al. .................. 716/136 |
| 7,453,261 B1 * | 11/2008 | Mark ........................ 324/754.03 |
| 7,482,886 B1 | 1/2009 | Kingsley |
| 7,810,058 B1 * | 10/2010 | Tuan ............................. 716/109 |
| 2007/0074011 A1 * | 3/2007 | Borkar et al. ................. 712/227 |
| 2009/0058444 A1 * | 3/2009 | McIntyre ...................... 324/755 |

* cited by examiner

*Primary Examiner* — Melissa Koval
*Assistant Examiner* — Courtney McDonnough
(74) *Attorney, Agent, or Firm* — Thomas George; John J. King

(57) ABSTRACT

An embodiment of a method to characterize a die is disclosed. The embodiment of the method includes measuring a quality metric of the die, and determining, prior to a final test stage, whether the quality metric of the die satisfies a first constraint, where the first constraint is more stringent than a second constraint at the final test stage for the quality metric of the die.

20 Claims, 8 Drawing Sheets

CHARACTERIZING DIES

FIELD OF THE INVENTION

An embodiment pertains to integrated circuits, and more particularly, to characterizing dies.

BACKGROUND OF THE INVENTION

Any steps taken during the manufacturing and packaging of integrated circuits (ICs) which improve wafer yield or reduce the time and resources for determining functioning dies or die characteristics is important. ICs are tested and characterized at different points during the process by which they are fabricated and packaged. The test and characterization data can be used to grade the performance of the dies which are packaged to form the ICs, and to eliminate dies that fail to meet performance (e.g., speed) standards set by a manufacturer. ICs are also referred to herein as, e.g., packaged dies or chips.

During a testing phase referred to as "wafer sort", functional tests are typically performed on dies. At this point, the dies are fully formed, but have not yet been "diced" (separated into individual chips) or packaged. Dies are typically produced on silicon wafers, each wafer having many dies. The functional test results are analyzed, and the dies that fail to pass functional tests are discarded. After the dies are cut from the wafer and separated from each other, and after the dies that failed the wafer sort test have been eliminated, the remaining dies are assembled into their packages. The dies may be offered in many different packages. The packaging process can involve attaching bond wires or solder bumps to the I/O bonding pads of the die, connecting the die to a substrate, and enclosing the die in a protective package. Once packaging is complete, another set of tests during a "final test" phase, is performed. During the final test phase, automated test equipment (ATE) tests the performance of the fully packaged dies, and, as with the wafer sort test, dies that fail to meet the performance standards set by a manufacturer are discarded.

During the final test phase, various measurements allow the better dies to be separated from the normal or below normal performing dies. An accurate and repeatable test system can sort the individual die into speed categories in a process generally referred to as speed binning. That is, a die is assigned a bin number based upon the results of a series of tests, where the bin number provides an indication of the speed of the die. For example, a die that passes all high-speed tests would be placed in a different bin indicative of faster operating characteristics, such as operating frequency. Speed binning is typically used to identify packaged dies that can operate at frequencies in excess of a baseline frequency for sale at a premium price.

Manufacturers packaging and selling high performance dies may, after speed binning, be left with many low performance dies which cannot be sold to the customer requesting high performance dies and thus will be kept in inventory until another customer requests dies with lower performance requirements and the same packaging. Because speed binning is done on packaged dies, those lower performing dies have a high inventory cost because packaged dies typically depreciate about 30% per year. Because of the high inventory costs of packaged dies, a manufacturer will be more profitable if it keeps its unsold inventory of packaged dies to a minimum.

Therefore, it is desirable to minimize the number of lower performing dies that are packaged when manufacturing and fulfilling orders for high performance dies.

SUMMARY OF THE INVENTION

An embodiment of a method to characterize a die includes: measuring a quality metric of the die; and determining, prior to a final test stage, whether the quality metric of the die satisfies a first constraint, where the first constraint is more stringent than a second constraint at the final test stage for the quality metric of the die.

An embodiment of a device includes: a measuring unit to measure a quality metric of a die; and a characteristic checking unit, coupled to the measuring unit, to determine, prior to a final test stage, whether the quality metric of the die satisfies a first constraint, where the first constraint is more stringent than a second constraint at the final test stage for the quality metric of the die.

An embodiment of a method to reduce inventory costs includes: characterizing a die based on whether a quality metric of the die satisfies a first constraint, where the first constraint is more stringent than a second constraint at a final test stage for the quality metric of the die. The embodiment of the method further includes dicing a wafer that includes the die; and binning the die based on the quality metric of the die.

BRIEF DESCRIPTION OF THE DRAWINGS

Accompanying drawings show one or more embodiments; however, the accompanying drawings should not be taken to limit the invention to only the embodiments shown. Various aspects and advantages will become apparent upon review of the following detailed description and upon reference to the drawings in which.

DETAILED DESCRIPTION OF THE DRAWINGS

Figure 1:
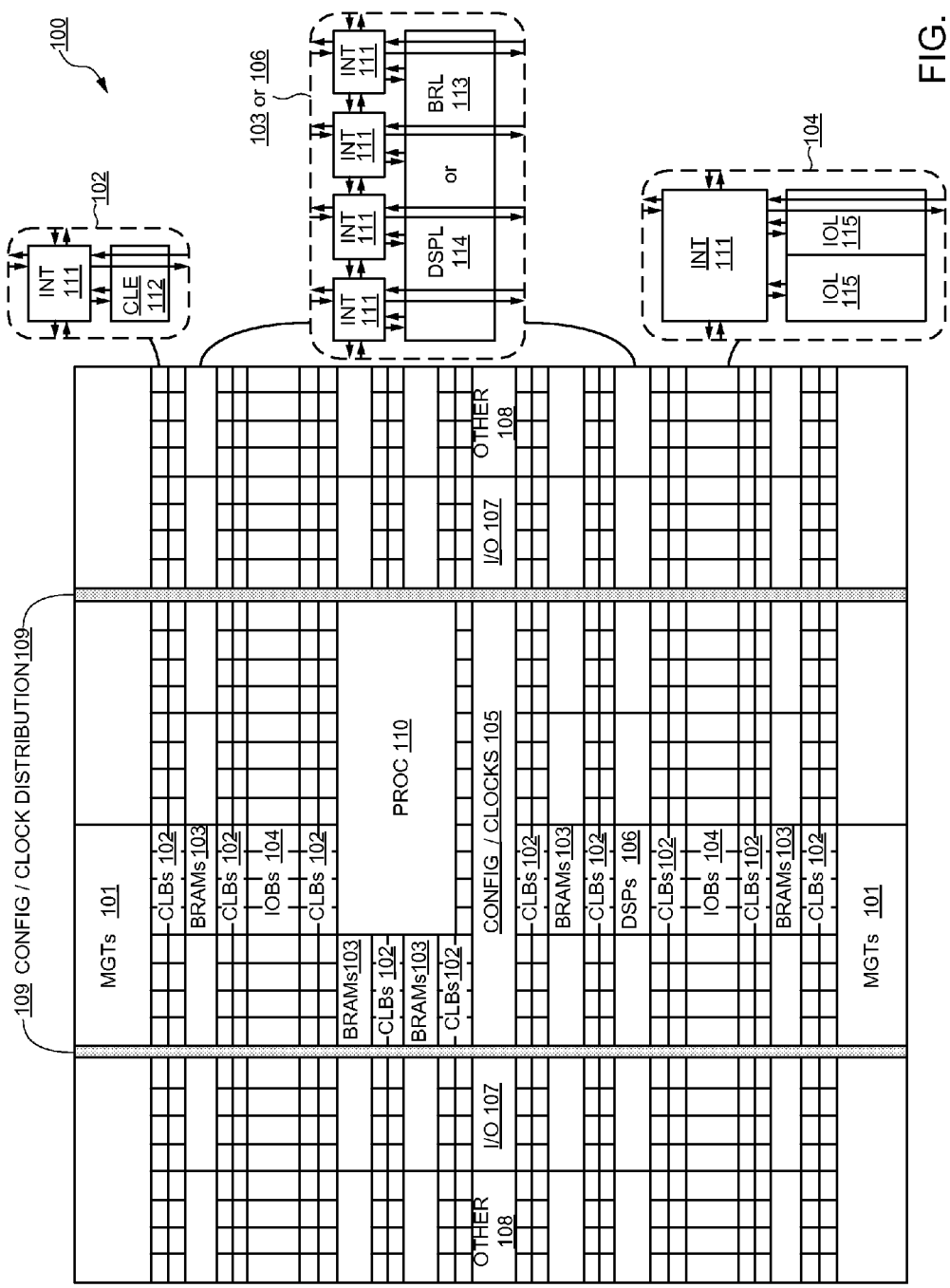
FIG. 1 shows a block diagram of an FPGA according to an embodiment.

An embodiment pertains to binning a die based on a quality metric of the die during a wafer sort stage rather than at a final test stage. A first constraint for the quality metric of the die at the wafer sort stage is more stringent than a second constraint at the final test stage for the quality metric of the die. The die (which is yet to be packaged) is binned and stored in a die bank based on whether the die satisfies the more stringent first constraint. Since the dies stored in the die bank have not yet been packaged, the inventory of packaged dies is greatly reduced, and there is flexibility in choosing how the dies will be packaged when a customer order is received.

The quality metric can be, for example, the following: (a) a performance of the die (e.g., speed); (b) a power consumption of the die; (c) a functionality of the die (e.g., the amount of usuable memory on the die, a number of functional processors on the die, a number of functional processors on the die that satisfy a functional processor constraint, a number of functional through die vias (TDVs), and a number of components satisfying a temperature grade); (d) a single event upset (SEU) immunity of the die; (e) a random defect rate of the die; (f) a capacitance measure of the die; (g) a functional yield of the die; and/or (h) a number of repaired defects of the die. Any combination of these quality metrics can be measured and used to bin the die.

Regarding performance tests, it is counterintuitive to perform these tests at the wafer sort stage since some components such as input/output (I/O) components cannot be checked during the wafer sort stage since these components may not yet be connected (the I/O components are typically connected during the packaging stage). Because the performance tests are typically performed after the chip is packaged during the final test stage, it is counterintuitive to perform the performance tests for a second time during the wafer sort stage since conventional thinking is that the performance tests performed at the wafer test stage may be redundant or less accurate than the performance tests performed during the final test stage.

One or more embodiments are applicable to ICs. Some embodiments are provided below that employ field programmable gate arrays (FPGAs). However, the embodiments of the invention are not limited to FPGAs, but rather can be applied to any type of ICs.

A programmable logic device (PLD) is an integrated circuit device designed to be user-programmable so that users may implement logic designs of their choices. One type of PLD is the Complex Programmable Logic Device (CPLD). A CPLD includes two or more "function blocks" connected together and to input/output (I/O) resources by an interconnect switch matrix. Each function block of the CPLD includes a two-level AND/OR structure similar to that used in a Programmable Logic Array (PLA) or a Programmable Array Logic (PAL) device. Another type of PLD is a field programmable gate array (FPGA). In a typical FPGA, an array of configurable logic blocks (CLBs) is coupled to programmable input/output blocks (IOBs). The CLBs and IOBs are interconnected by a hierarchy of programmable routing resources. These CLBs, IOBs, and programmable routing resources are customized by loading a configuration bitstream, typically from off-chip memory, into configuration memory cells of the FPGA. For both of these types of programmable logic devices, the functionality of the device is controlled by configuration data bits of a configuration bitstream provided to the device for that purpose. The configuration data bits may be stored in volatile memory (e.g., static memory cells, as in FPGAs and some CPLDs), in non-volatile memory (e.g., flash memory, as in some CPLDs), or in any other type of memory cell.

FIG. 1 shows a block diagram of an FPGA 100 according to an embodiment. The FPGA 100 has a large number of different programmable tiles including multi-gigabit transceivers (MGTs) 101, CLBs 102, random access memory blocks (BRAMs) 103, input/output blocks (IOBs) 104, configuration and clocking logic (CONFIG/CLOCKS) 105, digital signal processing blocks (DSPs) 106, specialized input/output blocks (I/O) 107 (e.g., configuration ports and clock ports), and other programmable logic 108 such as digital clock managers, analog-to-digital converters, and system monitoring logic. Some FPGAs also include dedicated processor blocks (PROC) 110, which may be used to implement a software application, for example.

In some FPGAs, each programmable tile includes a programmable interconnect element (INT) 111 having standardized connections to and from a corresponding interconnect element in each adjacent tile. Therefore, the programmable interconnect elements taken together implement the programmable interconnect structure for the illustrated FPGA. The programmable interconnect element 111 also includes the connections to and from the programmable logic element within the same tile, as shown by the examples included at the top of FIG. 1.

For example, a CLB 102 may include a configurable logic element (CLE) 112 that may be programmed to implement user logic plus a single programmable interconnect element 111. A BRAM 103 may include a BRAM logic element (BRL) 113 in addition to one or more programmable interconnect elements. The BRAM comprises dedicated memory separate from the distributed RAM of a configuration logic block. Typically, the number of interconnect elements included in a tile depends on the height of the tile. In the pictured embodiment, a BRAM tile has the same height as four CLBs, but other numbers (e.g., two or five) may also be used. A DSP tile 106 may include a DSP logic element (DSPL) 114 in addition to an appropriate number of programmable interconnect elements. An IOB 104 may include, for example, two instances of an input/output logic element (IOL) 115 in addition to one instance of the programmable interconnect element 111. The location of connections of the device is controlled by configuration data bits of a configuration bitstream provided to the device for that purpose. The programmable interconnects, in response to bits of a configuration bitstream, enable connections comprising interconnect lines to be used to couple the various signals to the circuits implemented in programmable logic, or other circuits such as BRAMs or the processor.

In the pictured embodiment, a horizontal area near the center of the die is used for configuration, clock, and other control logic. Vertical areas 109 extending from this column are used to distribute the clocks and configuration signals across the breadth of the FPGA. Some FPGAs utilizing the architecture illustrated in FIG. 1 include additional logic blocks that disrupt the regular columnar structure making up a large part of the FPGA. The additional logic blocks may be programmable blocks and/or dedicated logic. For example, the processor block PROC 110 shown in FIG. 1 spans several rows of CLBs and BRAMs.

Note that FIG. 1 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 1 are purely exemplary. For example, in an actual FPGA, more than one adjacent column of CLBs is typically included wherever the CLBs appear, to facilitate the efficient implementation of user logic. The FPGA can be, for example, the Virtex®-4 FPGA, the Virtex-5 FPGA, or the Virtex-6 FPGA all available from Xilinx, Inc. of San Jose, Calif.

Figure 2:
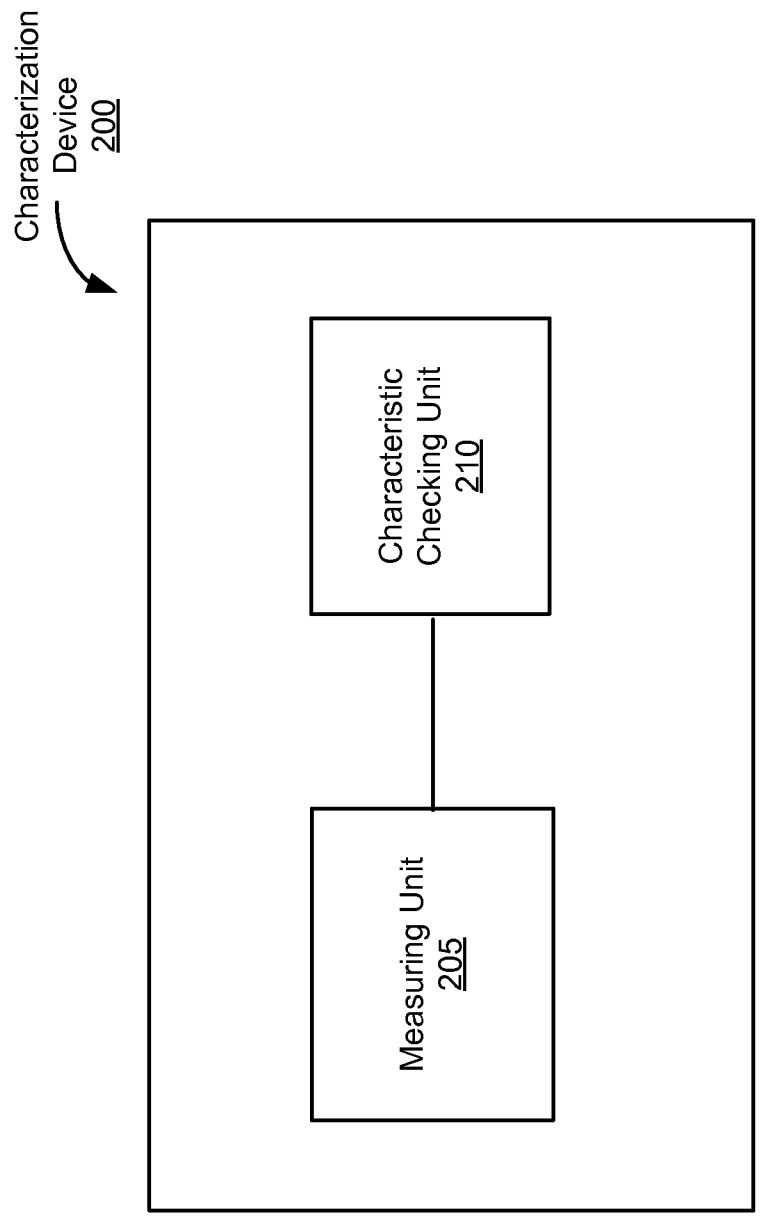
FIG. 2 shows a characterization device according to an embodiment.

FIG. 2 shows a characterization device 200 according to an embodiment. The characterization device 200 can be used to measure the quality metric (e.g., the functionality, the performance, and/or the power consumption) of a die and then characterize the die based on the measured quality metric of the die. The characterization device 200 includes a measuring unit 205 to measure the quality metric of the die. The characterization device 200 further includes a characteristic checking unit 210 that determines, prior to a final test stage, whether the quality metric of the die satisfies a first constraint.

The first constraint used at the wafer sort stage is more stringent than a second constraint at the final test stage for the quality metric of the die. For example, if the die has different speed grades, then the first constraint can be more stringent than that required by the particular speed grade ordered by a customer. As described in greater detail below, the device 200 can be located within the die whose quality metric is being measured, or alternatively, the device 200 can be external to the die that is being measured. If the device 200 is located external to the die, then for example, the device 200 can be located within a test unit that is external to the die.

Figure 3:
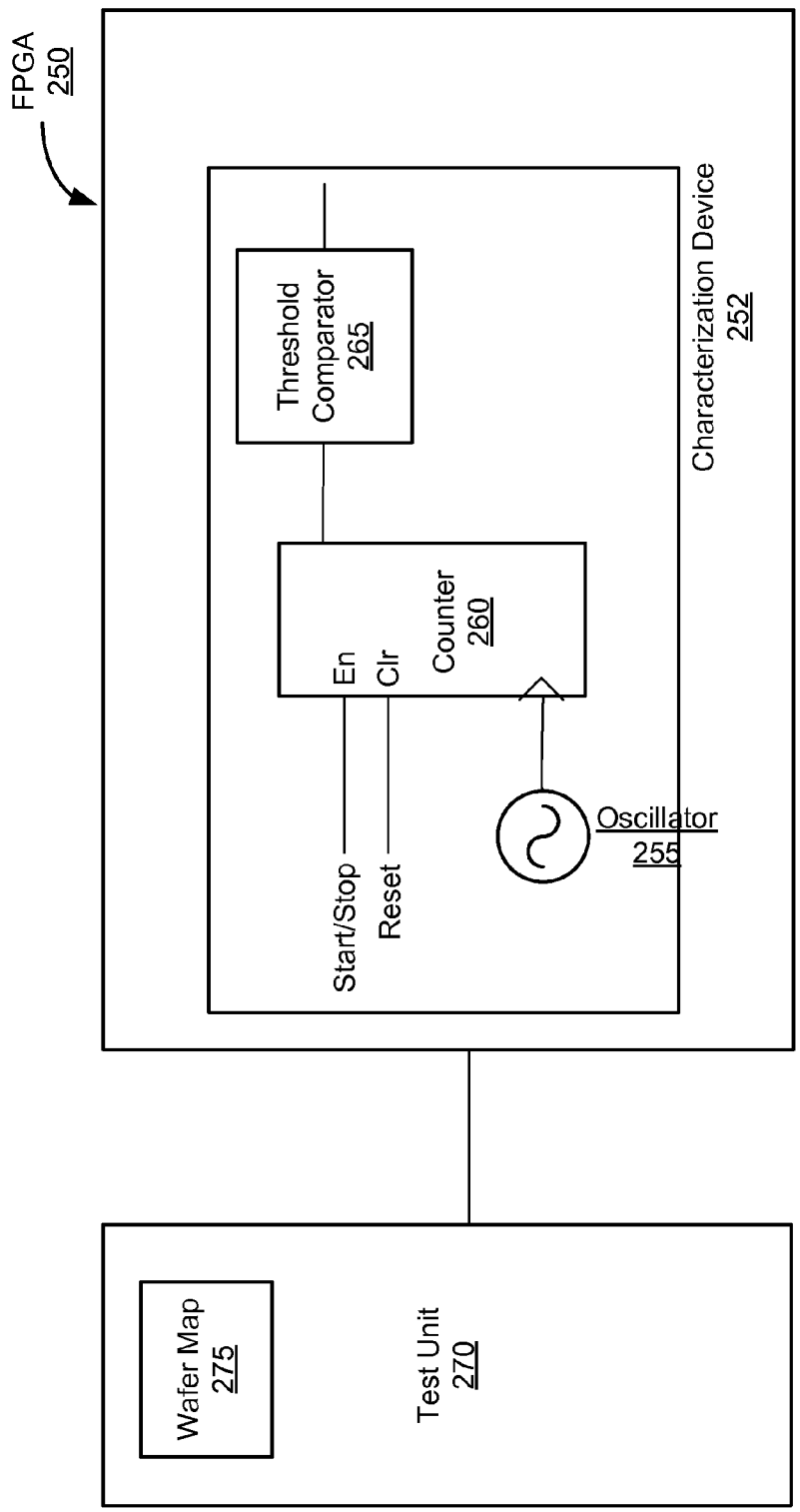
FIG. 3 shows a die that is a PLD that includes a characterization device according to an embodiment.

FIG. 3 shows a die that is a programmable logic device (PLD) such as, for example, an FPGA 250 that includes a characterization device 252 according to an embodiment. In this embodiment, the characterization device 252 is within the FPGA 250. Here, during the wafer sort stage, the performance of the FPGA 250 is measured using built-in self-test (BIST) techniques. The characterization device 252 includes an oscillator 255, a counter 260, and a threshold comparator 265. One or more CLBs of the FPGA 250 can be configured using configuration bits to instantiate the oscillator 255. Similarly, one or more CLBs of the FPGA 250 can be configured to instantiate the counter 260, and also one or more CLBs of the FPGA 250 can be configured to instantiate the threshold comparator 265. Alternatively, one CLB can be configured to instantiate a combination of the oscillator 255, the counter 260, and the threshold comparator 265. In addition, multiple oscillators, counters, and threshold comparators can be instantiated in order to test multiple timing paths. In such a case, the pass value from the multiple threshold comparators can be logically combined (e.g., can be ANDed together) to generate a cumulative pass value.

Figure 4:
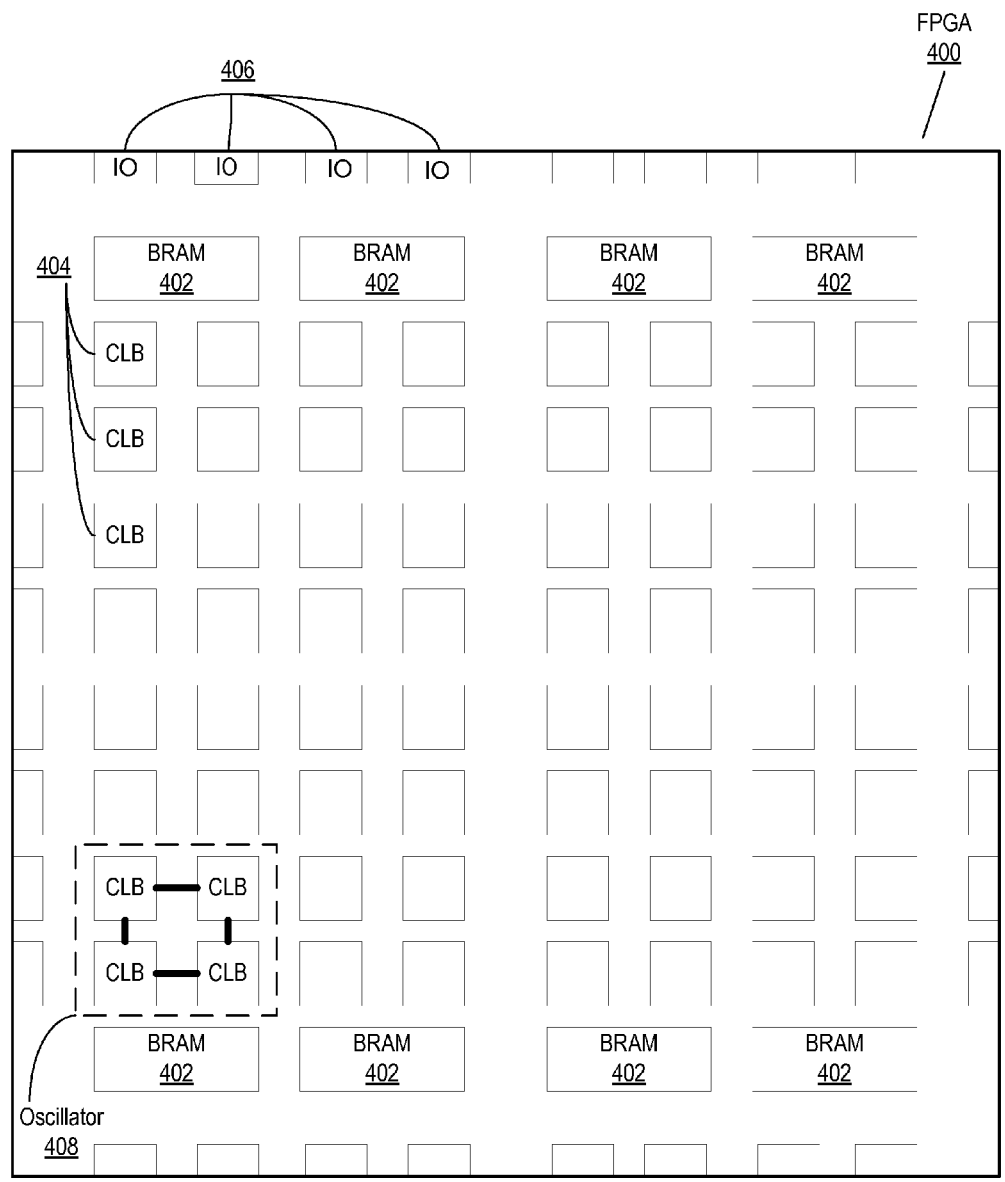
FIG. 4 shows an FPGA configured with an oscillator according to an embodiment.

More specifically, for example, FIG. 4 shows a FPGA 400 configured with an oscillator 408 according to an embodiment. The FPGA 400 includes BRAMs 402 for storage, CLBs 404, and IOs 406 to communicate with other devices. The oscillator 408 is implemented by combining four CLBs 404 in a ring formation and each CLB 404 constitutes one buffer in the ring. The oscillator 408 creates an independent clock signal whose frequency will depend on the propagation delay of the transistors making up the CLBs 404. The four CLBs 404 may also implement a counter and a threshold comparator within one of those CLBs. Alternatively, the counter may be implemented using another CLB 404, and the threshold comparator may be implemented using yet another CLB 404.

In FIG. 3, the clock signal that is output by the oscillator 255 is coupled to the clock input of the counter 260. A count value generated by the counter 260 is based on the frequency of the clock signal that is input to the counter 260. A start or stop signal can be input into the counter 260 to instruct the counter 260 to start counting or stop counting. Also, a reset signal can be input into the counter 260 to instruct the counter 260 to reset the count value to zero. The count value is output from the counter 260 and sent to the threshold comparator 265.

The threshold comparator 265 determines whether the count value is greater than a first threshold count value (i.e., the first constraint), and the threshold comparator 265 generates a pass value to indicate whether the count value is greater than the first threshold count value (i.e., the threshold comparator 265 determines whether the performance satisfies the first constraint) and thus whether the die (e.g., FPGA 250) should be placed in the sure sort bin.

The first threshold count value used at the wafer sort stage is greater than a second threshold count value used at the final test stage. For example, assume that the first threshold count value is "24" and a count value of "25" is generated by the counter 260 during a particular start and stop time interval at the wafer sort stage. Since the count value of "25" is greater than the first threshold count value of "24", the threshold comparator 265 generates a pass value of "TRUE" to indicate that the count value is greater than the first threshold count value and thus the die (e.g., FPGA 250) should be placed in the sure sort bin. In this example, assume that the second threshold count value is "22" which is less than the first threshold count value, and thus since the count value of "25" was generated during the wafer sort stage, the FPGA 250 should also easily pass the performance test at the final test stage.

Alternatively, rather than generate the pass value, the threshold comparator 265 can generate a rank value based on the count value. The rank value allows the FPGAs to be ranked based on their performance. The rank value provides more details regarding the FPGA's performance than that provided by the pass value. For example, the FPGA can be ranked "fast" if the count value is greater than a first threshold count value; ranked "medium" if the count value is less than the first threshold count value but greater than a second threshold count value that is less than the first threshold count value; or ranked "slow" if the count value is less than the second threshold count value but greater than a third threshold count value that is less than the second threshold count value. The rank value allows the die (e.g., FPGA 250) to be binned in multiple bins based on the results of the performance tests (e.g., count values) at the wafer sort stage; for example, the die can be binned in a fast bin, a medium bin, or a slow bin based on the rank value.

During the wafer sort stage, after the performance of the die (e.g., FPGA 250) has been determined, the die can be electronically marked with the pass value, the count value, or the rank value. The die can be electronically marked using, e.g., fuses. If the marking is done using fuses, then the pass value can be represented by using a single fuse where a programmed fuse can indicate that the pass value is "TRUE" meaning that the count value is greater than the first threshold count value. Alternatively, the count value or the rank value can be represented by using two or more fuses. For example, if two fuses are used for ranking, then the die can be marked with a rank value of "0" (this can represent that the die is ranked "fail"), "1" (this can represent that the die is ranked "slow"), "2" (this can represent that the die is ranked "medium"), or "3" (this can represent that the die is ranked "fast"). In addition, during the wafer sort stage, a wafer map 275 can be generated that indicates the pass value, the count value, or the rank value for the particular die (e.g., FPGA 250) on the wafer. The wafer map 275 can be stored in a database on a test unit 270 and used later when packaging the die after the wafer has been diced. For example, if the count value is stored in the wafer map 275, then the top "N" dies having the largest count values can be selected for packaging after dicing the wafer.

The test unit 270 can send the start or stop signal to the counter 260 to instruct the counter 260 to start or stop counting. In addition, the test unit 270 can also send the reset signal to the counter 260 to reset the count value to zero. Alternatively, rather than using the test unit 270 which is external to the FPGA 250, a digital clock manager (DCM) or phase locked loop (PLL) that are internal to the FPGA 250 can be used to generate the start signal, the stop signal, and the reset signal.

In another embodiment, during the wafer sort stage, the test unit 270 can measure the power consumption of the FPGA 250. For example, the test unit 270 can measure the power consumption of the FPGA 250 by measuring the current on the power pins of the FPGA 250 when the FPGA 250 is being configured with a user design using the configuration bits. The measured power consumption can be compared with a first threshold power value (i.e., the first constraint), and a pass value can be generated to indicate whether the measured power consumption is less than the first threshold power value (i.e., the pass value can indicate whether the measured power consumption satisfies the first constraint) and thus whether the die (e.g., FPGA 250) should be placed in the sure sort bin.

The first threshold power value used at the wafer sort stage is greater than a second threshold power value used at the final test stage. For example, assume that the first threshold power value at the wafer sort stage is "150 mW" and the measured power consumption is "140 mW". Since the measured power consumption of "140 mW" is less than the first threshold power value of "150 mW", the test unit 270 generates a pass value of "TRUE" to indicate that the measured power consumption is less than the first threshold power value and thus this die (e.g., FPGA 250) should be placed in the sure sort bin. In this example, assume that the second threshold power value is "200 mW" which is greater than the first threshold power value, and thus since power consumption was measured to be "150 mW" during the wafer sort stage, the FPGA 250 should also easily pass the power test at the final test stage. In addition, as explained above, rather than generate the pass value, the test unit 270 can generate a rank value based on the measured power consumption.

In addition to measuring the performance and the power consumption, the measuring unit 205 may also measure the functionality of the die. For example, a die may contain memory, some of which may be faulty. The die may be shipped with different amounts of functional memory. The measuring unit 205 may perform a memory test and record the amount of usable memory as a measure of functionality. In another embodiment, the measuring unit 205 may test multiple processors on a die and measure the number of functional processors, the number of functional processors satisfying a performance constraint, and/or the number of processors meeting power and performance constraints. A combination of these functional aspects may be measured; in addition, other functional aspects of a die may also be measured/tested. The characteristic checking unit 210 determines if the functionality of the die satisfies a first constraint for the functionality, where the first constraint for the functionality is more stringent than a second constraint for the functionality at the final test stage. For example, the constraints for the amount of usable memory, the number of functional processors, and/or the number of functional processors satisfying a functional processor constraint can be greater at the wafer sort stage than at the final test stage.

In addition, other quality metrics can be measured and used to bin the die. For example, the quality metrics can be the single event upset (SEU) immunity of the die; the random defect rate of the die; the capacitance measure of the die; (g) the functional yield of the die; and/or the number of repaired defects of the die. Furthermore, any combination of the quality metrics can be used to bin the die. For example, the FPGA 250 can be placed in the sure sort bin only if both the performance and the power consumption of the FPGA 250 satisfies the first constraint at the wafer sort stage (that is, e.g., the count value is greater than the first threshold count value, and also the measured power consumption is less than the first threshold power value). Alternatively, for example, if the rank value is used, the FPGA 250 is ranked "fast" if the count value is greater than the first threshold count value and also greater than a first threshold power value.

Figure 5:
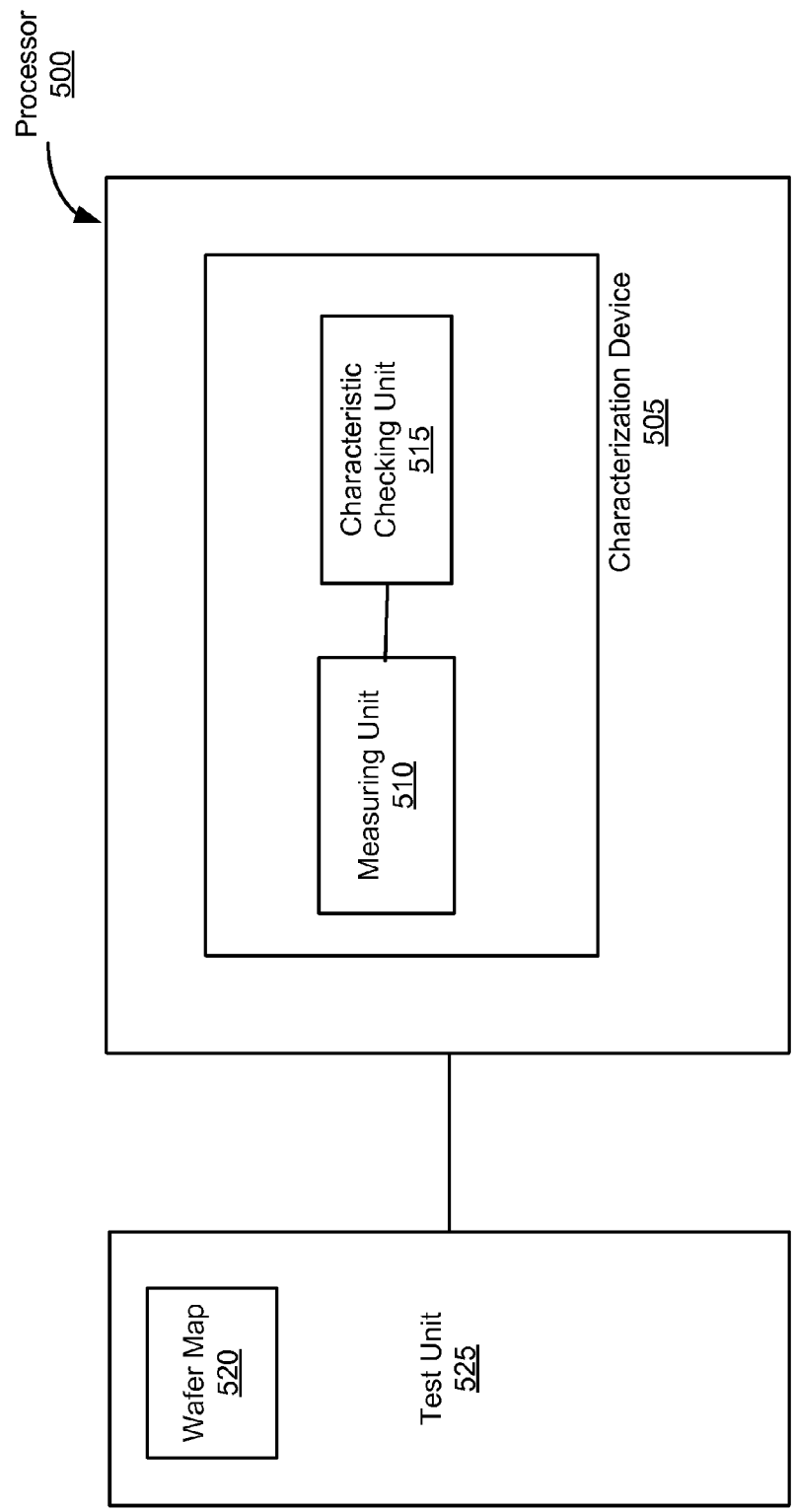
FIG. 5 shows a die that is a processor that includes a characterization device according to an embodiment.

FIG. 5 shows a die that is a processor 500 that includes a characterization device 505 according to an embodiment. In this embodiment, the processor 500 is programmed as a characterization device 505 that includes a measuring unit 510 and a characteristic checking unit 515. The measuring unit 510 executes a test routine on the processor 500 while the processor 500 is running at a first clock rate during the wafer sort stage. The first clock rate at the wafer sort stage (i.e., the first constraint) is faster than a second clock rate at which the processor 500 runs at the final test stage (i.e., the second constraint). The characteristic checking unit 515 determines whether the test routine executed by the processor 500 running at the first clock rate generated a correct result, and the characteristic checking unit 515 generates a pass value to indicate whether the processor 500 running at the first clock rate generated the correct result (i.e., the characteristic checking unit 515 determines whether the performance of the processor 500 satisfies the first constraint) and thus whether the die (e.g., processor 500) should be placed in the sure sort bin. Alternatively, in another embodiment, the measuring unit 510 executes multiple test routines and whether the characteristic checking unit 515 generates the pass value is based on whether a specified number of the test routines generated correct results.

Alternatively, in yet another embodiment, rather than generate the pass value, the characteristic checking unit 515 can generate a rank value. In this embodiment, the measuring unit 510 can execute multiple test routines and the rank value can be based on the number of test routines that generated the correct results. For example, if the measuring unit 510 executed five different test routines and four of the test routines generated correct results, then the processor 500 can be ranked as "fast". In addition, as described above, the die/processor can be electronically marked, or a wafer map 520 can be generated to indicate the pass value, the count value, or the rank value for the particular die (e.g., processor 500) on the wafer.

In another embodiment, during the wafer sort stage, the test unit 525 can measure the power consumption of the processor 500. For example, the test unit 525 can load a test routine into the processor 500 and measure the power consumption of the processor 500 by measuring the current on the power pins of the processor 500 when the processor 500 is executing the test routine. The measured power consumption can be compared with a first threshold power value (i.e., the first constraint), and a pass value can be generated to indicate whether the measured power consumption is less than the first threshold power value (i.e., the pass value can indicate whether the measured power consumption satisfies the first constraint) and thus whether the die (e.g., processor 500) should be placed in the sure sort bin. The first threshold power value used at the wafer sort stage is greater than a second threshold power value used at the final test stage. As described above, both the performance and also the power consumption of the processor 500 can be used to bin the processor 500.

Figure 6:
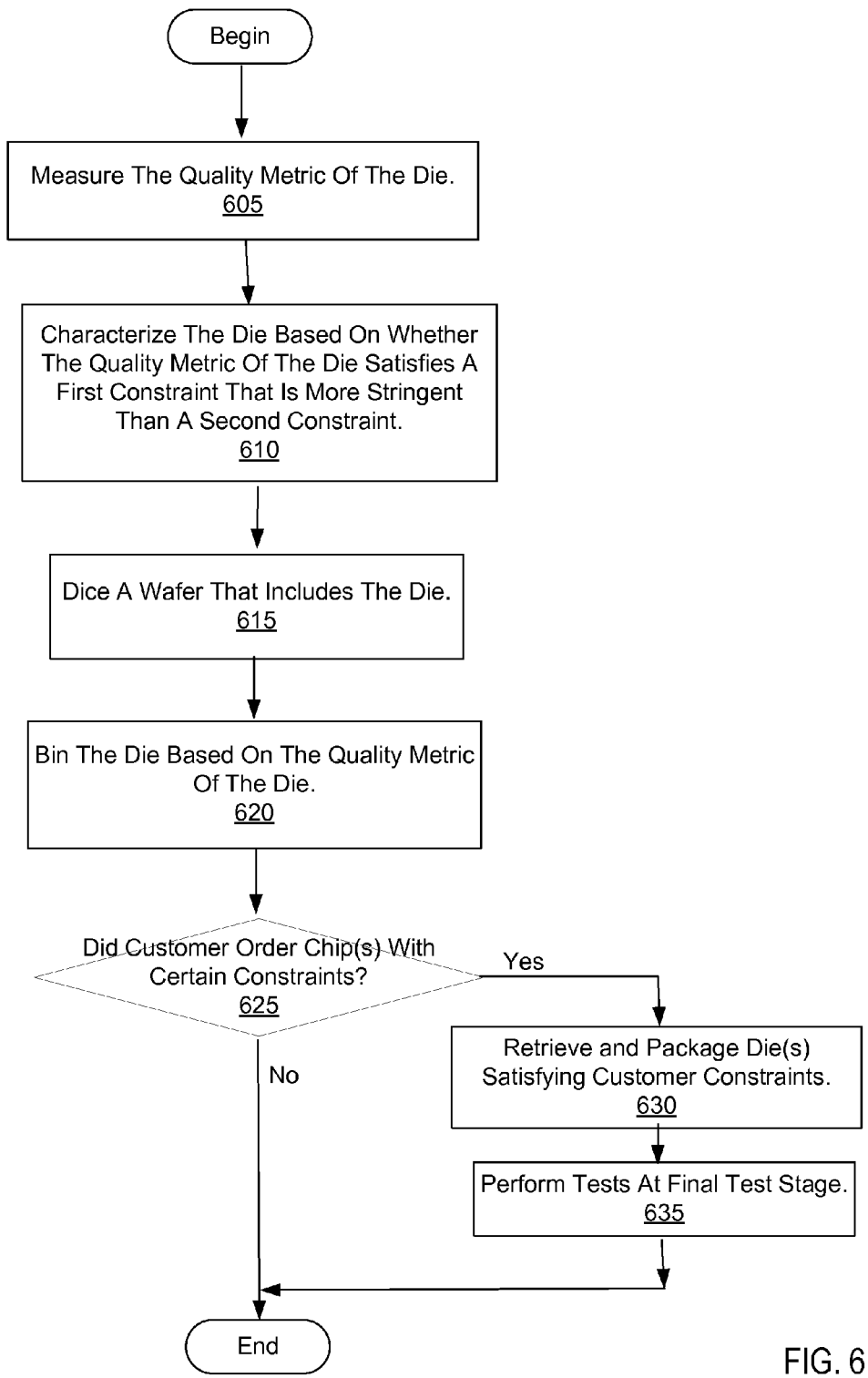
FIG. 6 shows a chip manufacturing flow according to an embodiment.

FIG. 6 shows a chip manufacturing flow according to an embodiment. In block 605, during the wafer sort stage, the quality metric of the die is measured. For example, the performance and the power consumption of the die can be measured by, e.g., any of the components described above such as, e.g., the measuring unit, the oscillator and counter, or the test unit. During the wafer sort stage, functional tests can be performed. Functional tests include testing whether the die functions as designed under prescribed operating conditions. Typically, functional tests are carried out by applying test patterns to the input terminals and comparing the generated output signals with expected patterns. Examples of functional tests typically performed on dies include checking whether certain components such as look-up tables, interconnects, and memory cells are working properly. In addition, heat can be added during the wafer sort stage in order to more closely simulate conditions during the final test stage.

In block 610, during the wafer sort stage, the die is characterized based on whether the quality metric of the die satisfies the first constraint that is more stringent than the second constraint, at the final test stage, for the quality metric of the die. The first constraint is more stringent such that if the die satisfies the first constraint, then it will also satisfy the true second constraint at the final test stage. For example, in the case of performance, some chips such as FPGAs are offered in multiple speed grades, and the higher speed grades are sold at higher prices. The first constraint is more stringent such that the uncertainty due to sort tester variation is taken into account for a particular speed grade. In addition, if the wafer sort stage occurs at room temperature, the first constraint can be made even more stringent to account for the possibly higher temperatures present during the final test stage. On the other hand, the first constraint can be made less stringent if the wafer sort stage occurs at temperatures higher than room temperature.

Since the chip will pass the performance tests at the final test stage due to the more stringent first constraint, it is optional whether performance tests at the final test stage are performed (i.e., performance tests at the final test stage can be eliminated). If the die passes the more stringent first constraint, then the performance tests at the final test stage can be eliminated and only, e.g., open-short leakage tests can be performed to assure proper assembly, and thus cheaper testers can be used during the final test stage. During the wafer sort stage, if a die does not satisfy the first constraint and falls in the "uncertain" guard band, then performance tests can be performed at the final test stage and if the die passes these performance tests, then it can be placed in the sure sort bin or fast bin.

In block 615, a wafer that includes the die is diced. In block 620, during the wafer sort stage, the die is binned and stored in a die bank based on the quality metric of the die. For example, if the die (this die has not yet been packaged) satisfies the more stringent first constraint (the first constraint is referred to as "constraint A" in this example), then the die can be packaged in the sure sort bin or the fast bin. However, if the die does not satisfy the first constraint but satisfies a "constraint B" that is less stringent than the "constraint A", then the die can be placed in the medium bin. However, if the die does not satisfy the "constraint B" but satisfies a "constraint C" that is less stringent than the "constraint B", then the die can be placed in the slow bin. The dies that fail to satisfy "constraint C" can be discarded. The "constraint B" and "constraint C" can be more stringent than the constraints for the medium bin and the slow bin at the final test stage. Performance tests may be performed at multiple environment settings, including different voltage and temperature settings. To make a more stringent test, the performance tests may be performed at a different voltage level than the intended voltage of the shipped device. For example, the performance of a die may be measured at 0.95 volts instead of an expected 1.0 volts in order to expose voltage-dependent slowdown that might affect the final test performance.

Since the dies stored in the die bank have not yet been packaged, the inventory of packaged dies is greatly reduced, and there is flexibility in choosing how the dies will be packaged when a customer order is received. The inventory costs for unpackaged dies is cheaper than the inventory costs for dies which have already been packaged. This is because the dies in the die bank can be packaged for a different customer who orders a different package, but the dies that are already packaged cannot be redirected to different customers who order different packages. One positive effect of storing the dies in the die bank is that fewer low speed dies are packaged when high speed chips are ordered by a customer; the packaged low speed dies may be difficult to sell because it is uncertain when another customer will request the low speed packaged dies.

In block 625, it is determined if a customer ordered chip(s) with certain constraints for the quality metric (e.g., the functionality, the performance, and/or the power consumption) of the chip(s). If no customer order is currently active, then the manufacturing flow completes. However, if a customer order is currently pending, then in block 630, die(s) satisfying the customer constraints are retrieved from the die bank and packaged. There are different types of die packages (e.g., flip-chip and wire bonding) and the type of package used depends on the type ordered by the customer. Typically, the chip is encapsulated to complete the packaging process.

In block 635, tests are performed at the final test stage. The tests performed at the final test stage include functional tests and I/O tests. As explained earlier, since one or more quality metric tests (e.g., the functionality, the performance, and/or the power consumption tests) have already been performed during the wafer sort stage, such tests can be eliminated at the final test stage. Alternatively, during the final test stage, the performance only of components whose performance is dependent on packaging is measured. For example, the performance of the output driver is dependent on packaging because connections to I/O pins are needed in order to test the output driver. On the other hand, an example of a package independent component is a logic block because the measured performance will be approximately equal at the wafer sort stage and also the final test stage.

In broad terms, a method to characterize a die includes: (a) measuring the quality metric of the die, and (b) determining, prior to a final test stage, whether the quality metric of the die satisfies the first constraint, where the first constraint is more stringent than a second constraint at the final test stage for the quality metric of the die. In more specific terms, the paragraphs below describe characterizing the performance of a die that is either a programmable logic device (PLD) or a processor.

Figure 7:
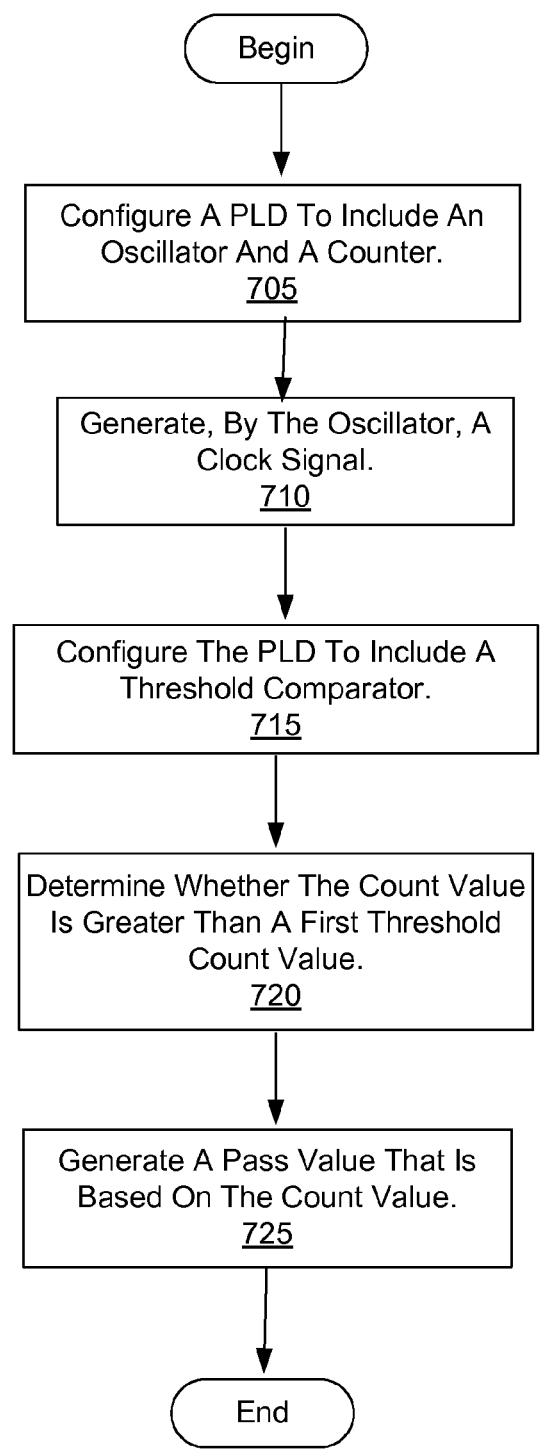
FIG. 7 shows a method to characterize the performance of a PLD according to an embodiment.

FIG. 7 shows a method to characterize the performance of a PLD according to an embodiment. In block 705, an IC such as the PLD can be configured to include an oscillator and a counter. In block 710, the oscillator generates a clock signal which is fed to the clock input of the counter. The counter generates a count value which is based on the frequency of the clock signal that is fed to the counter. In block 715, the PLD is configured to include a threshold comparator. In block 720, the threshold comparator determines whether the count value is greater than a first threshold count value (i.e., the first constraint). In block 725, the threshold comparator generates a pass value to indicate whether the count value is greater than the first threshold count value (i.e., the threshold comparator determines whether the performance satisfies the first constraint) and thus whether the die (e.g., the PLD) should be placed in the sure sort bin.

Figure 8:
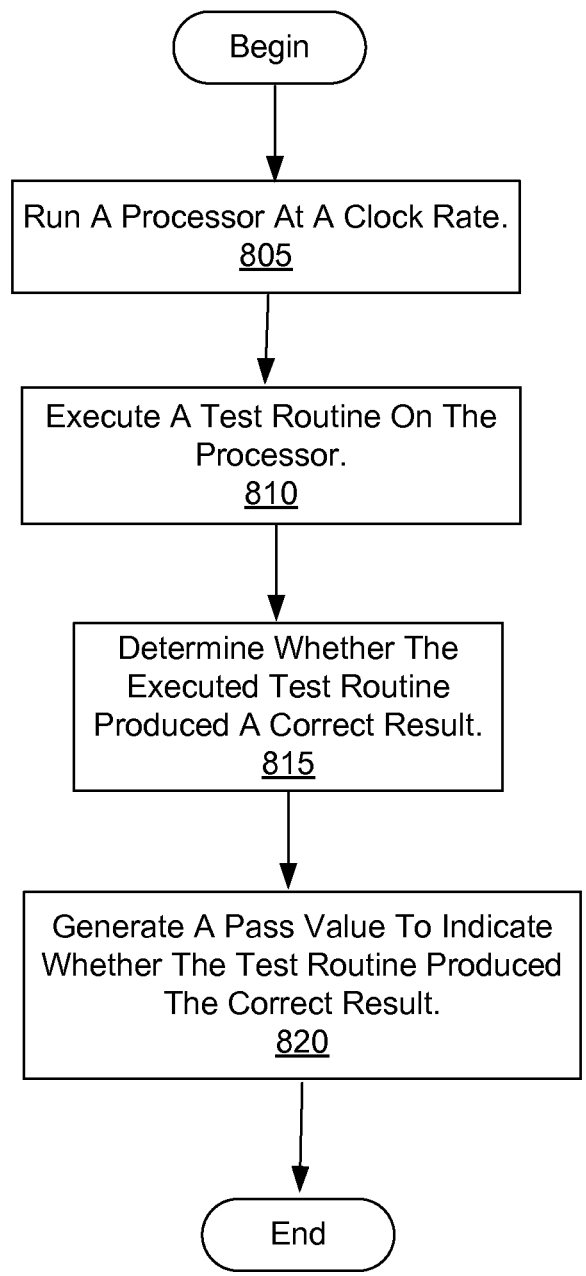
FIG. 8 shows a method to characterize the performance of a processor according to an embodiment.

FIG. 8 shows a method to characterize the performance of a processor according to an embodiment. In block 805, the IC such as the processor is run at a first clock rate or a first voltage level during the wafer sort stage. The first clock rate at the wafer sort stage (i.e., the first constraint) is faster than a second clock rate at which the processor runs at the final test stage (i.e., the second constraint). In block 810, a test routine is executed by the processor running at the first clock rate. In block 815, it is determined whether the processor produced a correct result. In block 820, a pass value is generated to indicate whether the processor running at the first clock rate generated the correct result, and thus whether the die (e.g., the processor) should be placed in the sure sort bin.

As any person of ordinary skill in the art of integrated circuits (e.g., FPGAs and processors) will recognize from the description, figures, and examples that modifications and changes can be made to the embodiments of the invention without departing from the scope of the invention defined by the following claims.

What is claimed is:

1. A method to characterize a die, comprising:
   measuring a quality metric of the die during a wafer sort stage;
   determining, prior to a final test stage, whether the quality metric of the die satisfies a first constraint, wherein the first constraint is more stringent than a second constraint at the final test stage for the quality metric of the die;
   selecting a die to be packaged based upon the measuring of the quality metric of the die during the wafer sort stage;
   establishing that the packaged die satisfies the second constraint at the final test stage based upon the determination that the die satisfies the first constraint during the wafer sort stage.

2. The method of claim 1, wherein the measuring the quality metric of the die comprises measuring at least one of: (a) a performance, (b) a power consumption, (c) a functionality, (d) a single event upset (SEU) immunity, (e) a random defect rate, (f) a capacitance measure, (g) a functional yield, and (h) a number of repaired defects of the die, and
   wherein the determining, prior to the final test stage, whether the quality metric of the die satisfies the first constraint comprises determining, prior to the final test stage, whether at least one of the following satisfies the first constraint: (a) the performance, (b) the power consumption, (c) the functionality, (d) the SEU immunity, (e) the random defect rate, (f) the capacitance measure, (g) the functional yield, and (h) the number of repaired defects of the die.

3. The method of claim 2, wherein the die is a programmable logic device (PLD) comprising a plurality of configuration logic blocks (CLBs), and wherein measuring the quality metric of the die comprises measuring the performance of the PLD by:
   configuring a first portion of the plurality of CLBs as an oscillator;
   configuring a second portion of the plurality of CLBs as a counter;
   generating, by the oscillator, a clock signal;
   transmitting the clock signal to a clock input of the counter; and
   generating, by the counter, a count value.

4. The method of claim 3, wherein determining, prior to the final test stage, whether the quality metric of the die satisfies the first constraint comprises determining, prior to the final test stage, whether the performance of the PLD satisfies the first constraint by:
   configuring a third portion of the plurality of CLBs as a threshold comparator;
   determining, using the threshold comparator, whether the count value is greater than a first threshold count value; and
   generating a pass value to indicate whether the count value is greater than the first threshold count value, wherein the first threshold count value is greater than a second threshold count value at the final test stage.

5. The method of claim 2, wherein the die is a processor, and wherein measuring the quality metric of the die comprises measuring the performance of the processor by:
   running the processor at a clock rate that is faster than another clock rate at which the processor runs at the final test stage; and
   executing a test routine on the processor running at the first clock rate.

6. The method of claim 5, wherein determining, prior to the final test stage, whether the quality metric of the die satisfies the first constraint comprises determining, prior to the final test stage, whether the performance of the processor satisfies the first constraint by:
   determining whether the test routine executed by the processor running at the first clock rate produced a correct result, wherein the first clock rate is faster than a second clock rate at which the processor runs at the final test stage; and
   generating a pass value to indicate whether the test routine executed by the processor running at the first clock rate produced the correct result.

7. The method of claim 2, wherein the die is a PLD comprising a plurality of CLBs, and wherein measuring the quality metric of the die comprises measuring the power consumption of the die by:
   configuring a portion of the plurality of CLBs; and
   measuring the power consumption when configuring the portion of the plurality of CLBs.

8. The method of claim 2, wherein the die is a processor, and wherein measuring the quality metric of the die comprises measuring the power consumption of the processor by:
   loading a test routine into the processor;
   executing the test routine; and
   measuring the power consumption when executing the test routine.

9. The method of claim 3, further comprising:
   generating a rank value based on the count value;
   storing, in a wafer map, the rank value corresponding to the die;
   after a wafer sort stage, retrieving, from the wafer map, the rank value corresponding to the die; and
   determining whether to package the die based on the rank value corresponding to the die.

10. The method of claim 2, wherein measuring the quality metric of the die comprises measuring the functionality of the die by:
    measuring at least one of an amount of usable memory on the die, a number of functional processors on the die, and a number of functional processors on the die that satisfy a functional processor constraint,
    and wherein determining, prior to the final test stage, whether the quality metric of the die satisfies the first constraint comprises determining, prior to the final test stage, whether the functionality of the die satisfies the first constraint by:
       determining at least one of: whether the amount of usable memory on the die is greater than a first threshold usable memory value, whether the number of functional processors on the die is greater than a first threshold number of functional processors, and whether the number of functional processors on the die that satisfy the functional processor constraint is greater than a first threshold number of satisfying functional processors, wherein the first threshold usable memory value is greater than a second threshold usable memory value at the final test stage, the first threshold number of functional processors is greater than a second threshold number of functional processors at the final test stage, and the first threshold number of satisfying functional processors is greater than a second threshold number of satisfying functional processors at the final test stage.

11. A device, comprising:
a measuring unit to measure a quality metric of a die during a wafer sort stage; and
a characteristic checking unit, coupled to the measuring unit, to determine, prior to a final test stage, whether the quality metric of the die satisfies a first constraint, wherein the first constraint is more stringent than a second constraint at the final test stage for the quality metric of the die, and the die is established as satisfying the second constraint as a packaged die at the final test stage if the die satisfies the first constraint during the wafer sort stage.

12. The device of claim 11, wherein the device is within the die, and the die is a PLD comprising a plurality of CLBs, and wherein the measuring unit comprises:
a first portion of the plurality of CLBs configured as an oscillator to generate a clock signal, and
a second portion of the plurality of CLBs configured as a counter to generate a count value based on the clock signal, and
wherein the characteristic checking unit comprises:
a third portion of the plurality of CLBs configured as a threshold comparator, wherein the threshold comparator determines whether the count value is greater than a first threshold count value and the threshold comparator generates a pass value to indicate whether the count value is greater than the first threshold count value, wherein the first constraint is the first threshold count value that is greater than a second threshold count value at the final test stage.

13. The device of claim 11, wherein the device is within the die, and the die is a processor running at a first clock rate, wherein the processor is programmed to implement:
the measuring unit to execute a test routine on the processor running at the first clock rate, wherein the first constraint is the first clock rate at which the processor is running, and the first clock rate is faster than a second clock rate at which the processor runs at the final test stage, and
the characteristic checking unit to determine whether the test routine executed by the processor running at the first clock rate generated a correct result, and the characteristic checking unit generates a pass value to indicate whether the processor running at the first clock rate generated the correct result.

14. The device of claim 11, wherein the device is a test unit, wherein the test unit comprises a processor programmed to implement:
the measuring unit to measure a power consumption of the die by either: (a) measuring the power consumption when configuring a portion of a plurality of CLBs of the die, or (b) measuring the power consumption when the die executes a test routine, and
the characteristic checking unit to determine, prior to the final test stage, whether the power consumption of the die satisfies the first constraint by determining if the power consumption is less than a first threshold power consumption, and generates a pass value to indicate whether the first power consumption is less than the threshold power consumption, wherein the first constraint is the threshold power consumption which is lower than a second threshold power consumption at the final test stage.

15. A method to reduce inventory costs, comprising:
characterizing a die based on whether a quality metric of the die satisfies a first constraint at a wafer sort stage, wherein the first constraint is more stringent than a second constraint at a final test stage for the quality metric of the die;
establishing that the die will satisfy the second constraint at a final test stage if the die satisfies the first constraint during the wafer sort stage;
dicing a wafer that includes the die;
binning the die based on the quality metric of the die; and
selecting the die from the die bank to be packaged based upon the characterization that the quality metric of the die satisfies the first constraint at the wafer sort stage;
wherein the packaged die is established as satisfying the second constraint at the final test stage if the die satisfies the first constraint during the wafer sort stage.

16. The method of claim 15, further comprising, prior to characterizing the die, measuring the quality metric of the die.

17. The method of claim 16, wherein the measuring the quality metric of the die comprises measuring at least one of: (a) a performance, (b) a power consumption, (c) a functionality, (d) a SEU immunity, (e) a random defect rate, (f) a capacitance measure, (g) a functional yield, and (h) a number of repaired defects of the die, and
wherein the characterizing the die based on whether the quality metric of the die satisfies the first constraint comprises characterizing the die based on whether at least one of the following satisfies the first constraint: (a) the performance, (b) the power consumption, (c) the functionality, (d) the SEU immunity, (e) the random defect rate, (f) the capacitance measure, (g) the functional yield, and (h) the number of repaired defects of the die.

18. The method of claim 16, wherein the measuring the quality metric of the die only occurs at the wafer sort stage.

19. The method of claim 17, further comprising, after the die is packaged, measuring the performance only of components of the die whose performance is dependent on packaging.

20. The method of claim 15, further comprising, packaging the die only if the quality metric satisfies the first constraint.

* * * * *